(12) United States Patent
Johnson (10) Patent No.: US 11,408,567 B2
(45) Date of Patent: Aug. 9, 2022

(54) LASER HOUSING AND DUAL LIGHT SOURCE LIGHTING DEVICE WITH LASER

(71) Applicant: BlissLights LLC, Oceanside, CA (US)

(72) Inventor: Randy Johnson, San Marcos, CA (US)

(73) Assignee: BlissLights LLC, Oceanside, CA (US)

(*) Notice: Subject to any disclaimer, the term of this patent is extended or adjusted under 35 U.S.C. 154(b) by 0 days.

(21) Appl. No.: 17/350,676

(22) Filed: Jun. 17, 2021

(65) Prior Publication Data

US 2021/0310621 A1 Oct. 7, 2021

Related U.S. Application Data

(63) Continuation of application No. PCT/US2019/066970, filed on Dec. 17, 2019.

(60) Provisional application No. 62/780,846, filed on Dec. 17, 2018.

(51) Int. Cl.
*F21K 9/69* (2016.01)
*F21V 5/04* (2006.01)
*F21Y 115/30* (2016.01)
*F21Y 115/10* (2016.01)

(52) U.S. Cl.
CPC .......... *F21K 9/69* (2016.08); *F21V 5/04* (2013.01); *F21Y 2115/10* (2016.08); *F21Y 2115/30* (2016.08)

(58) Field of Classification Search
CPC .. F21K 9/69; F21V 5/04–048; F21Y 2115/10; F21Y 2115/30
USPC .......................................................... 362/259
See application file for complete search history.

(56) References Cited

U.S. PATENT DOCUMENTS

| | | | |
|---|---|---|---|
| 6,000,813 A | 12/1999 | Krietzman | |
| RE46,384 E | 5/2017 | Johnson | |
| 10,145,515 B2* | 12/2018 | Johnson | ............... F21V 29/777 |
| 2010/0049283 A1 | 2/2010 | Johnson | |
| 2011/0040358 A1 | 2/2011 | Bean et al. | |
| 2017/0328551 A1 | 11/2017 | Xi | |

OTHER PUBLICATIONS

International Search Report and Written Opinion in International Appln. No. PCT/US2019/066970, dated Mar. 17, 2020, 6 pages.
International Preliminary Report on Patentability in International Appln. No. PCT/US2019/066970, dated Jun. 16, 2021, 5 pages.

* cited by examiner

*Primary Examiner* — Jason M Han
(74) *Attorney, Agent, or Firm* — Fish & Richardson P.C.

(57) ABSTRACT

Disclosed herein is a housing for containing a laser and lens for use in a laser light projection display, and a lighting device incorporating the laser within the housing and other light sources, such as light-emitting diodes (LEDs). The laser and lens are secured within a housing and maintain a spaced distance using a spacer. The lighting device uses the laser in combination with LEDs arrayed around the laser to provide a dual source light.

13 Claims, 6 Drawing Sheets

LASER HOUSING AND DUAL LIGHT SOURCE LIGHTING DEVICE WITH LASER

TECHNICAL FIELD

The apparatus disclosed herein includes a lighting device for indoor or outdoor lighting applications.

BACKGROUND ART

Lighting design is both a science and an art. Comprehensive lighting design requires consideration of the amount of functional light provided, the energy consumed, as well as the aesthetic impact supplied by the lighting system. Lighting in such venues as casinos, theatres, nightclubs and concert stages are primarily concerned with enhancing the appearance and emotional impact of the architecture or concert through lighting systems. Therefore, it is important that the sciences of light production and luminaire photometrics are balanced with the artistic application of light as a medium in our built environment. Often, accent lighting for the type of venues described above can be extremely sophisticated and costly.

Smaller venues, such as restaurants, small businesses or even a home, also employ accent lighting. Such accent lighting is typically limited to "dimmer" lighting capabilities and/or monochromatic lighting. To utilize more sophisticated lighting systems in these types of venues can require special equipment, extensive electrical rewiring, and can often be cost-prohibitive.

In addition, indoor lighting using coherent light sources (e.g., lasers) are typically reserved for specialty situations. Conventional light bulbs use incoherent lighting. More recently, LED light bulbs, which are sources of coherent light, have been used for indoor lighting.

However, there is a need for an apparatus that allows for both coherent and conventional incoherent light sources. Such an apparatus would allow for the use of conventional incoherent indoor or outdoor lighting in combination with a coherent light source and also toggle between the two light sources.

In addition, there is a need for a lighting device having a small laser housing and that can be accurately and efficiently manufactured with the proper focal length.

SUMMARY OF INVENTION

A lighting device having a coherent light source such as a direct diode laser, not surrounded by a heatsink, the laser capable of producing a laser light when powered; a lens collimating the light produced by the laser; a stationary diffraction grating; a holographic optical element; a spacer between the laser and the lens having a distance defined as the focal length, wherein the spacer contacts the laser on one end and the lens on a second end; and a switched mode power supply for providing power to the laser, is herein disclosed.

A lighting device, including: a coherent light source; a lens collimating the light produced by the laser; a spacer having a first end and a second end between the laser and the lens having a distance defined as the focal length, wherein the spacer contacts the laser on the first end and the lens on the second end; a stationary diffraction grating; one or more LEDs; and a switched mode power supply for providing power to the laser and LEDs.

DESCRIPTION OF EMBODIMENTS

The following detailed description is of the best currently contemplated modes of carrying out the invention. The description is not to be taken in a limiting sense, but is made merely for the purpose of illustrating the general principles of the invention.

Embodiments of invention are directed to a lighting device for use in accent lighting applications. In one embodiment, the lighting device includes a coherent light source such as a laser, and a diffractive optical element. The diffractive optical element may be, for example, a holographic optical element. The lighting device may be adapted to retrofit into a pre-existing light fixture. In one application, the lighting device may project a static or movable star field and/or static or movable clouds.

A diffractive optical element (DOE) is a class of optics that operates on the principle of diffraction. Traditional optical elements use their shape to bend light. By contrast, diffractive optics break apart incoming waves of light into a large number of waves which then recombine to form completely new waves. DOEs can function as grating, lenses, aspheric or any other type of optical element. They offer unique optical properties that are not possible with conventional optical elements. In addition, DOEs can be fabricated in a wide range of materials including, but not limited to, aluminum, silicon, silica or plastic.

Figure 1:
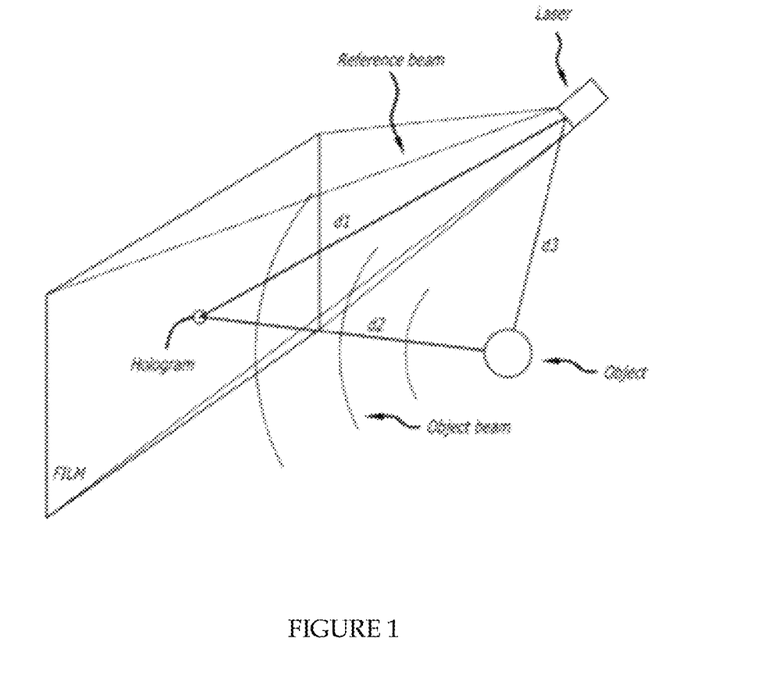
FIG. 1 illustrates an optical path set-up to produce a hologram.

Holography is a technique that allows the light scattered from an object to be recorded and later reconstructed so that it appears as if the object is in the same position relative to the recording medium as it was when recorded. The image changes as the position and orientation of the viewing system changes in exactly the same way is if the object were still present, thus making the recorded image, termed a hologram, appear three-dimensional. FIG. 1 illustrates an optical path set-up to produce a hologram.

A hologram can be produced from laser-light beams being scattered off of an object and interfered with by a reference beam. A two-dimensional recording medium, such as a photosensitive plate or holographic film, records three-dimensional volumetric phase information of an object which is termed a fringe or iterative Fourier transfer algorithm (IFTA) pattern. This procedure is similar to photography where white light scattered from photographed objects is recorded on silver halide film. Light has a phase (volume) and amplitude (intensity) but only intensity is recorded in conventional photography. A hologram, however, stores both amplitude and phase due to the interference of the reference beam. This reference beam possesses the same characteristics as scattered light because of the action of the laser. The phase information is the most important factor in holography because it provides the depth cues to the eyes and allows for an image to appear in three dimensions.

In the computer science field, a computer-generated holographic image is computed by numerically simulating the physical phenomena of light diffraction and interference. It is possible for computer software to calculate the phase of light reflected or transmitted from or through an object. Computing the phase of light of different objects, such as points, lines and wire frames, produces an interferential simulation that may in turn by transferred to a photographically sensitive media.

A holographic optical element (HOE) is a type of DOE. A holographic optical element is a hologram of a point source and acts as a lens or a mirror having optical power, I.e., the ability to focus light. The hologram consists of a diffraction pattern rendered as a surface relief which may be, for example, a thin film (created using photoresist and/or dichromated gelatin) containing an index modulation throughout the thickness of the film. "Index modulation" refers to a periodic feature set that has a linear distribution of patterns to produce novel optical effects created during the process of making the HOE. Either process (dichromated gelatin or photoresist) can be used to create a mathematical distribution to create a linear derivative producing a periodic feature set implemented into a phase mask. In one embodiment of the invention, a non-linear implementation of IFTA produces a logarithmic or otherwise hyperbolic IFPTA wave function that may be used to produce non-linear phase derivatives onto a diffractive surface. According to embodiments of the invention, holograms can be classified into two categories: (i) "reflection holograms" in which incidence and diffracted light are on the same side of the HOE; and (ii) "transmission holograms" in which incident and diffracted light are on opposite sides.

Figure 2:
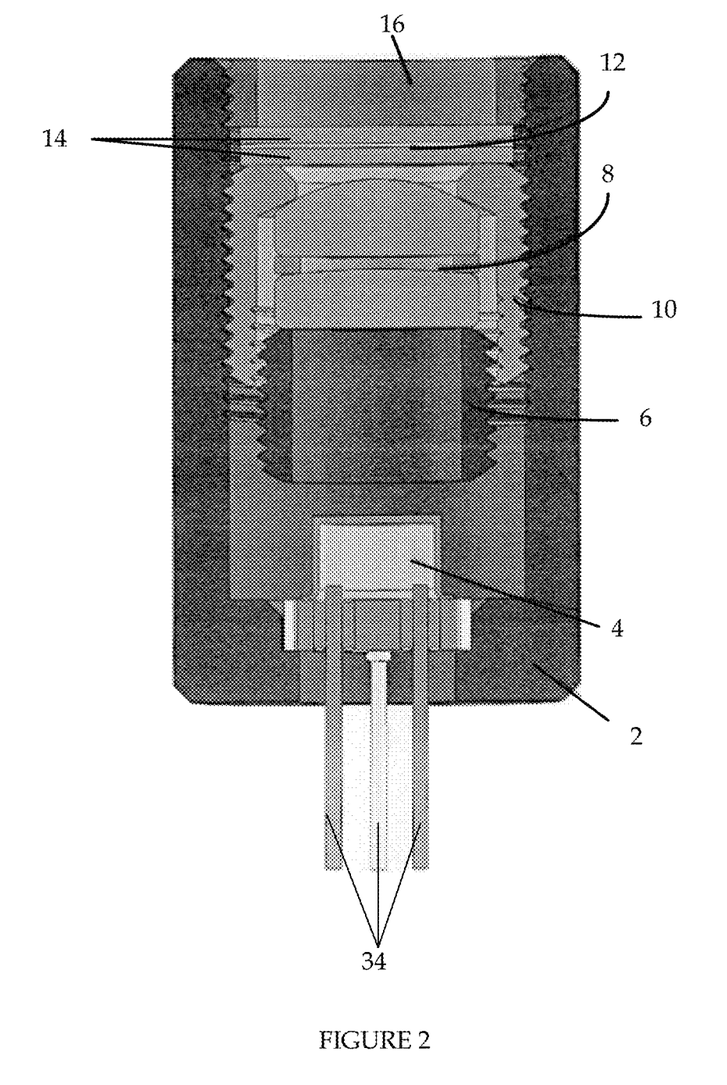
FIG. 2 illustrates a cut-through view of a laser and housing according to an embodiment of the apparatus.

FIG. 2 depicts a laser diode and associated housing and lens according to one embodiment of the apparatus. A cylindrical, hollow housing 2 is provided with laser 4 secured inside one end of the housing 2. The laser has three power leads 34 for connecting to a printed circuit board (shown in FIG. 3). The other end of the housing is threaded to receive an insert 10 housing a lens 8 and diffraction grating 12. The lens 8 is secured within the insert 10 such that, when the insert 10 is screwed inside the housing 2, the lens 8 is centered within the pathway of the light provided by the laser 2. The lens 8 is screwed in until the light from the laser is in focus. Focusing the light may be done manually, e.g., screwing the insert 10 holding the lens 8 in place into the housing 2, and then adjusting the distance until the light appears focused. Alternatively, the housing may be configured to provide that the lens 8 is engaged in a manner such that it rests at the optimal distance from the laser 2 for focusing. For example, the threading in the housing 2 may stop or bind the threads of the insert 10 at the place where the lens 8 is set for the optimal distance for best focus. Also alternatively, a spacer 6 may be provided that sets the lens 8 at the desired distance, and then when screwed into the housing 2, the spacer 6 stops the insert 10 from screwing further into the housing 2. A stationary diffraction grating 12 is secured to the end of the insert 10 in the path of the laser light. The grating 12 is secured in place by two rings 14. A lumen 16 is located at the end open end of the housing 2.

In an alternative embodiment, the diffraction grating can be printed directly on the lens, thereby integrating the diffraction grating and the lens into a single component.

In some embodiments, the laser 4 is a diode pumped solid state (DPSS) laser. A DPSS laser is a device that converts some form of energy (e.g., electrical, optical, chemical) into a narrow beam of light which is monochromatic, directional and coherent. "Monochromatic" means pertaining to light of one color or to radiation of a single wavelength or narrow range of wavelengths. "Directional" means that the beam of light is very well collimated with low divergence (e.g., less than 10 milliradians) and travels over long distances with very little spread in diameter. If a laser diode with a long cavity is used, the light produced by the laser may be highly collimated without any other modification to the light (e.g., by a lens). This is common among diode-pumped solid state lasers. If a direct diode laser is used, the light may be more divergent, in which case the lens used for focusing the light may be also be a collimating lens that reduces divergence in the light. "Coherent" means of or pertaining to waves that maintain a fixed phase relationship. The effect of one wave enhances the strength of every other wave so that the overall effect of coherent light is much greater than if the waves were not in phase. In one embodiment, the DPSS laser may be an FLPPS Class 2 single beam laser with a total laser power of about two hundred (200) milliWatts. In other embodiments, the laser of the lighting device is a direct diode laser light source whereas the laser light is produced from a solid state diode directly rather that a multiple optical crystal laser as in a DPSS type.

Figure 3:
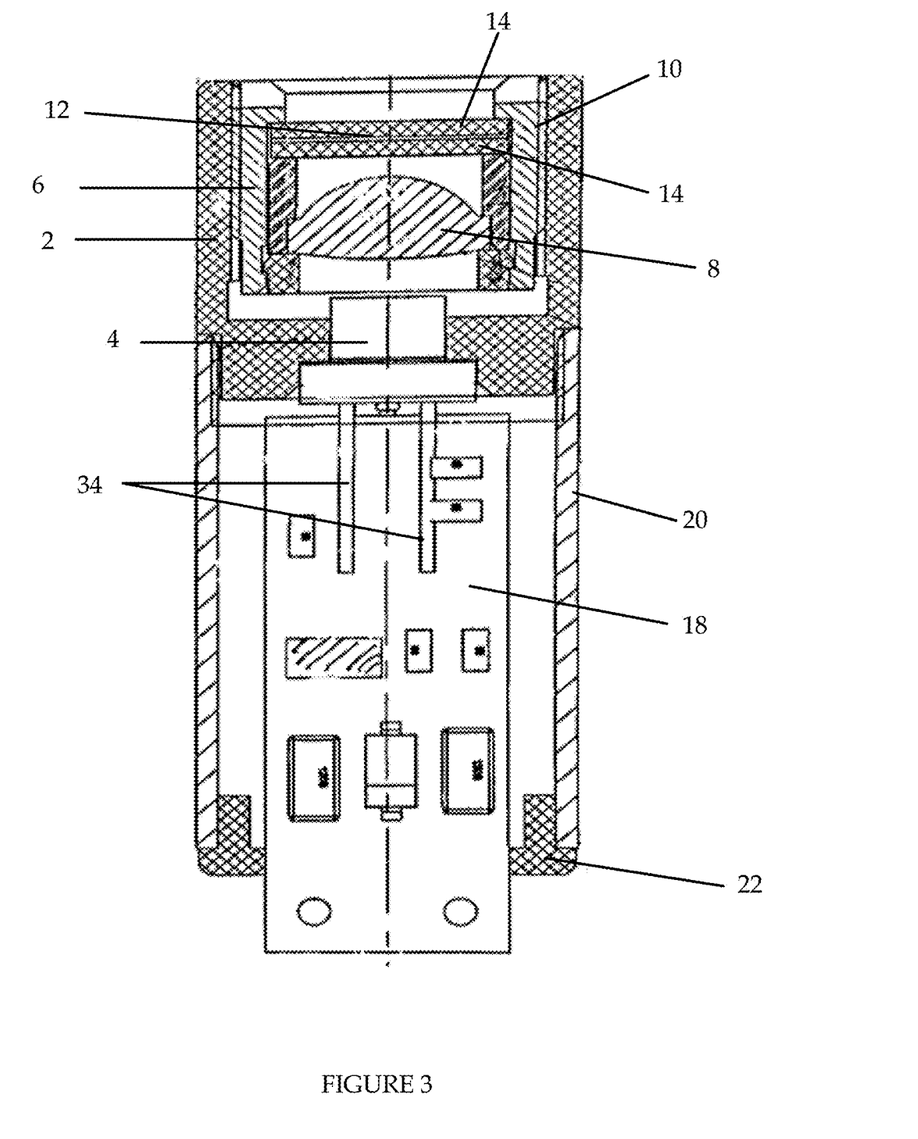
FIG. 3 illustrates a view of another embodiment of the laser and housing.

FIG. 3 provides an embodiment of the laser housing configuration in the apparatus. The laser 4 is located in one end of the housing 2, with the power leads connecting to a printed circuit board 18. The housing 2 has an insert 10 holding a lens 8. In this configuration, the insert 10 extends down to the internal base of the housing 2, and extends upward to the external edge of the housing 2 opposite the laser 4. The rings 14 holding the diffraction grating 12 in place are within the insert 10 in this embodiment.

The printed circuit board 18 is housed within a container 20 attached to the rear end of the housing 2. A cap 22 holds the printed circuit board 18 in place. As shown in the embodiment, the printed circuit board 18 extends through a slot in the cap 22 to permit access to wires for powering the printed circuit board 18 and laser 2.

Figure 6:
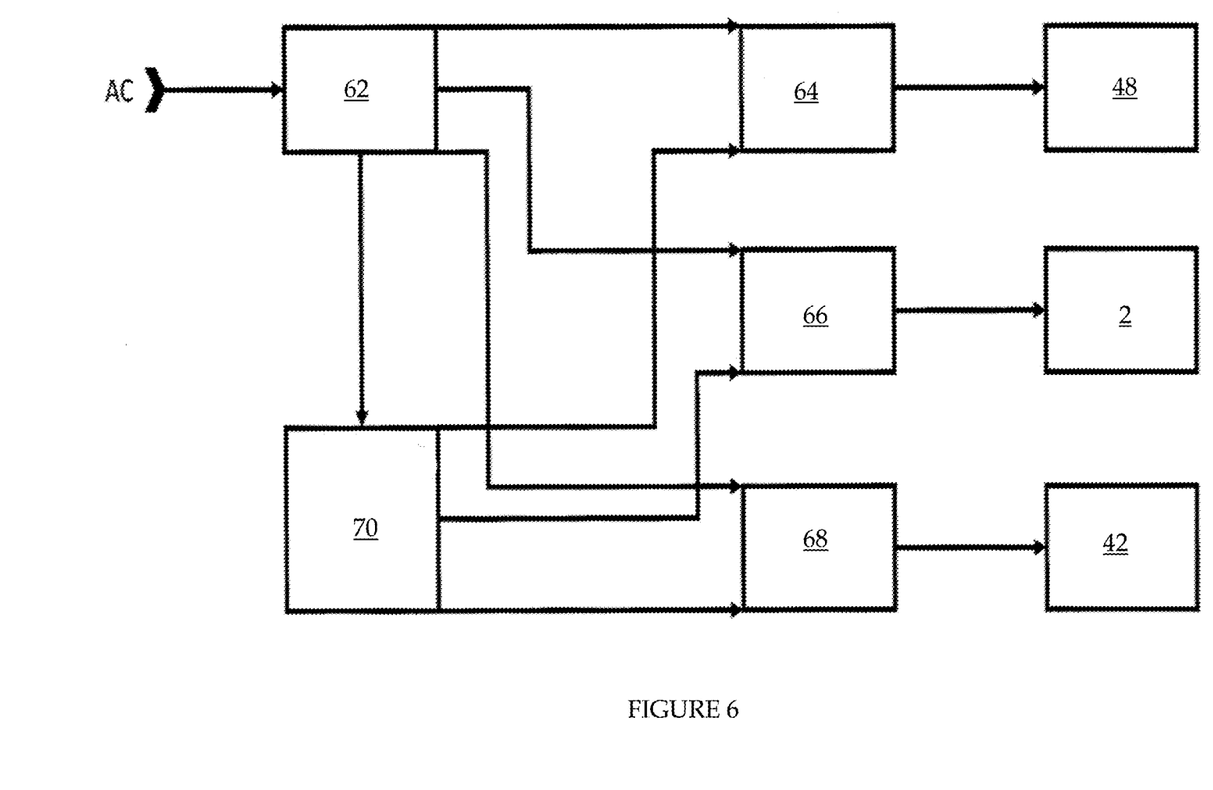
FIG. 6 illustrates the electrical schematic according to an embodiment of the apparatus.

The printed circuit board 18 can also include additional functionality to control the lighting of the LEDs (described below) and/or the laser. First, the board 18 as depicted in FIG. 6 has a receiver in wireless communication with a control device. This may be accomplished in any number of ways, using for example Bluetooth™ technology, radio waves, Ethernet connection, or other methods of wireless communication. The receiver is selected based on the type of communication technology chosen. The control device allows the user to instruct the processor to change the lighting as desired, in accordance with the variations in lighting that are allowed by the bulb.

The circuit board and the receiver are attached connected by wiring to power the various elements of the bulb described above. The control board also contains a memory containing the control software instructions and a processor for performing the instructions as desired. Along the desired functions, the control board may: control whether the LEDs are on or off; control whether the laser or other coherent light source is on or off; control the motor to rotate the holographic optical element into or out of the light pathway of the laser light; control other rotational optical elements such that they spin to creating a moving starfield or other effect; control the intensity of the laser light by increasing or decreasing the output voltage of the SMPS; or control other characteristics.

The embodiments of FIGS. 2 and 3 are small. The entire housing 2 for the laser can be on the order of 5-20 mm in length and have a diameter of approximately the same size, depending on the specific size and make of the laser and the distance to the lens necessary for providing proper focus. In some embodiments, the housing 2 is 12 mm long and has a diameter of 11.95 mm. By using a diffraction grating, the laser's output intensity can be reduced below 1 mW, thereby making it a Class II laser under current US safety standards.

The housing 2 is metal to conduct heat away from the laser 4. However, unlike prior art designs, there is no dedicated heatsink having multiple flanges for dissipating heat. As shown below in FIG. 4, the housing 2 and container 20 can be attached directly to a plate or other structural element of the lighting device, and heat is dissipated through it rather than a separate heatsink element.

The laser unit of FIGS. 2 and 3 may be connected directed to an electrical power source, such as an AC or DC electrical wire, battery, USB cable, or other power supplying element. The laser unit may be used without any additional housing, such that a user could simply display the laser device by itself. The laser unit may be connected to another device that draws power, and it may receive its electrical power from that other device.

Figure 4:
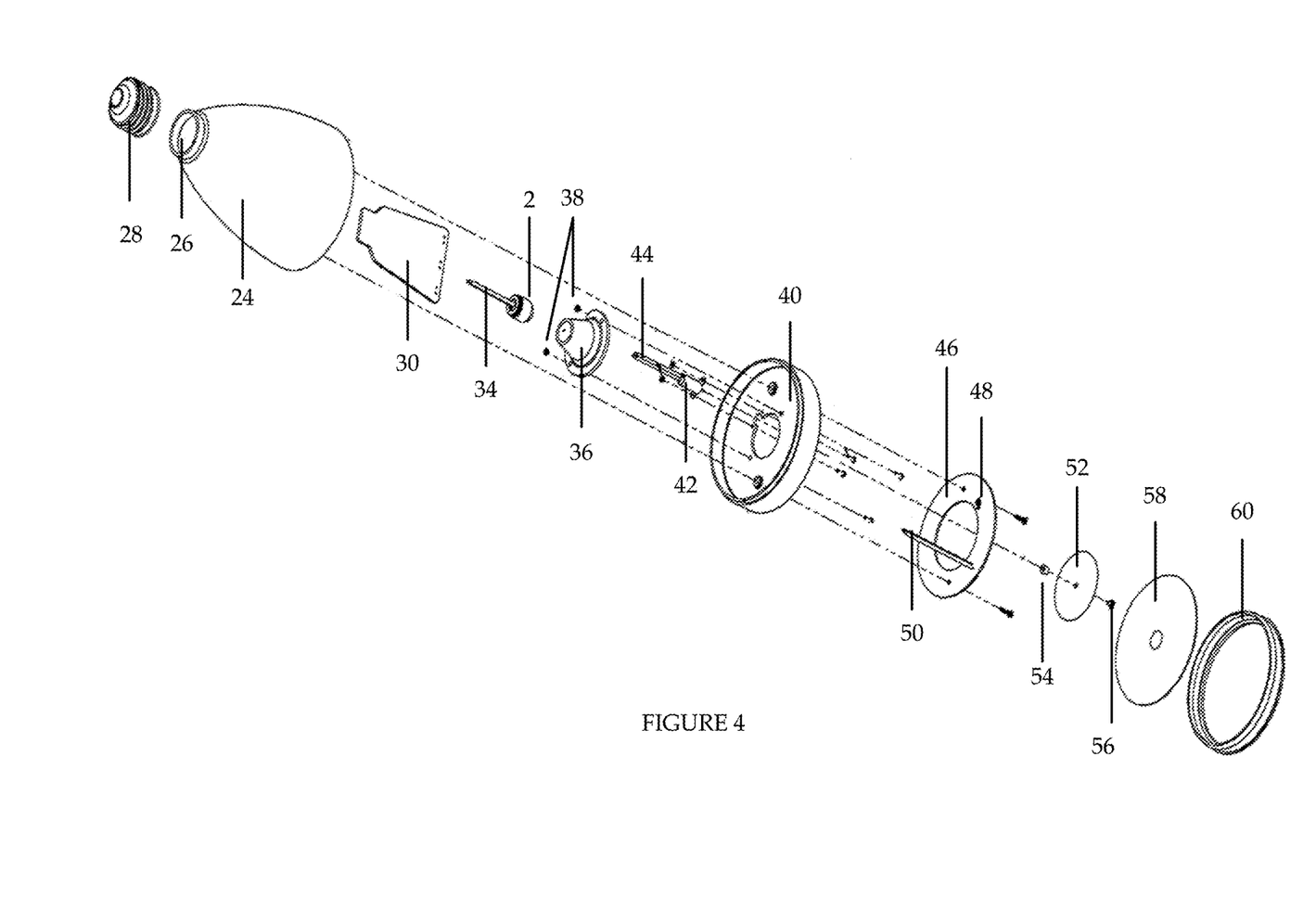
FIG. 4 illustrates an exploded view of a lighting device according to an embodiment of the apparatus.

FIG. 4 shows an embodiment of a lighting apparatus in an exploded view. The apparatus has a bulb exterior housing 24 in the shape of a standard lighting fixture (e.g. PAR 30, PAR 40, or the like). At one end 26 of the bulb is a base 28 for connecting the bulb to an electrical power source. This source can be any standard electrical connection, e.g., an electrical plug, an Edison light socket, a US power cable, or some other source. The source may be AC or DC power. If AC power, a switched-mode power supply (SMPS) is necessary to convert to DC power before power is provided to the laser 4. The SMPS 32 may be in electrical communication with laser 4 via a wire or electrical lead or any other means known by one of ordinary skill in the art. An SMPS is an electronic power supply unit that incorporates a switching regulator in order to provide the required output voltage. In one embodiment, the SMPS 32 may be affixed to or incorporated within the printed circuit board 18. However, other suitable locations for SMPS 32 are within the scope of the invention. In an alternative embodiment, a linear power supply may be used in place of SMPS 32 to provide the necessary drive voltage and current.

The SMPS is an electronic power supply unit that incorporates a switching regulator. The SMPS rapidly switches a power transistor between saturation (full on) and cutoff (completely off) with a variable duty cycle whose average is the desired output voltage. The resulting rectangular waveform is low-pass filtered with an inductor and capacitor. The main advantage of this method is greater efficiency because the switching transistor dissipates little power in the saturated state and the off state compared to the semiconducting state (active region). Other advantages include smaller size and lighter weight (from the elimination of low frequency transformers which have a high weight) and lower heat generation from the higher efficiency.

The power provided through the base 28 connects to the motherboard 30 that holds the printed circuit board 18 and the SMPS 32. The power leads 34 connect to the printed circuit board 18 and/or the switched mode power supply 32 to connect the laser 4 to power. The laser is housed within the housing 2 shown in FIG. 4. The housing 2 is itself enclosed within a conical plate 36 that encloses and positions the laser housing 2 within the lighting fixture. The conical plate 36 is attached by screws 38 to a primary plate 40 that is attached to the bulb exterior housing 24. A motor 42 is adjacent to the conical plate 36 and secured to the primary plate 40. Wires 44 extend from the motor 42 to the printed circuit board 18 for power.

An LED ring 46 securing one or more LEDs 48 is attached to the primary plate 40 on the side opposite the base 28. Wires 50 connect the LEDs 48 to the printed circuit board 18 for power. The LED ring 46 surrounds a rotating holographic optical element 52, such as a holographic diffraction grating. The holographic optical element 52 is connected to the motor 42 by a snap ring 54 positioned adjacent to a bottom surface of the holographic optical element, and a stem 56 supporting the holographic optical element 52 and snap ring 54. Thus, the holographic optical element 52 is rotated by the motor 42. This feature allows the light emanating from laser 4 to pass through holographic optical element 52 without interference from the supporting snap ring 54 and stem 56. The entire internal assembly of the bulb is then protected by a cover glass 58 or other clear plate and a housing top 60.

The embodiment depicted allows heat from both the laser and the LEDs to be dissipated through the body of the lighting fixture, rather than using dedicated heatsinks. However, a heatsink may be provided if the laser intensity is substantially stronger than those provided here. In such cases, the laser may be situated within the heatsink. The heatsink absorbs and dissipates heat emanating from the laser when activated. Heatsinks typically have a cylindrical or rectangular body formed of a material with high thermal conductivity (e.g. metal) with one or more fins to increase surface area and rapidly dissipate heat. The heatsink may be any suitable configuration.

Power may be provided through the base 28. The base may be a design such as an Edison base for screwing into a conventional light bulb socket. Other means of electrical power may be provided, such as a battery, USB port, or a standard electrical plug for connecting to a socket. When power is supplied to the device, the laser light projects through the rotating and stationary optical elements to produce a static or movable (i.e., animated) star field (i.e., pin-point lights). The stars may be any color; in one embodiment, the stars of the star field are green. Additionally, the clouds may be any color such as, but not limited to, red, orange, green, cyan, sky blue, royal blue and/or white. The device may also have dimming capabilities. In addition, the LED lights may be on at the same time to provide additional lighting. If the lasers are turned off, then the LEDs can function as an LED white-light bulb for lighting.

Figure 5:
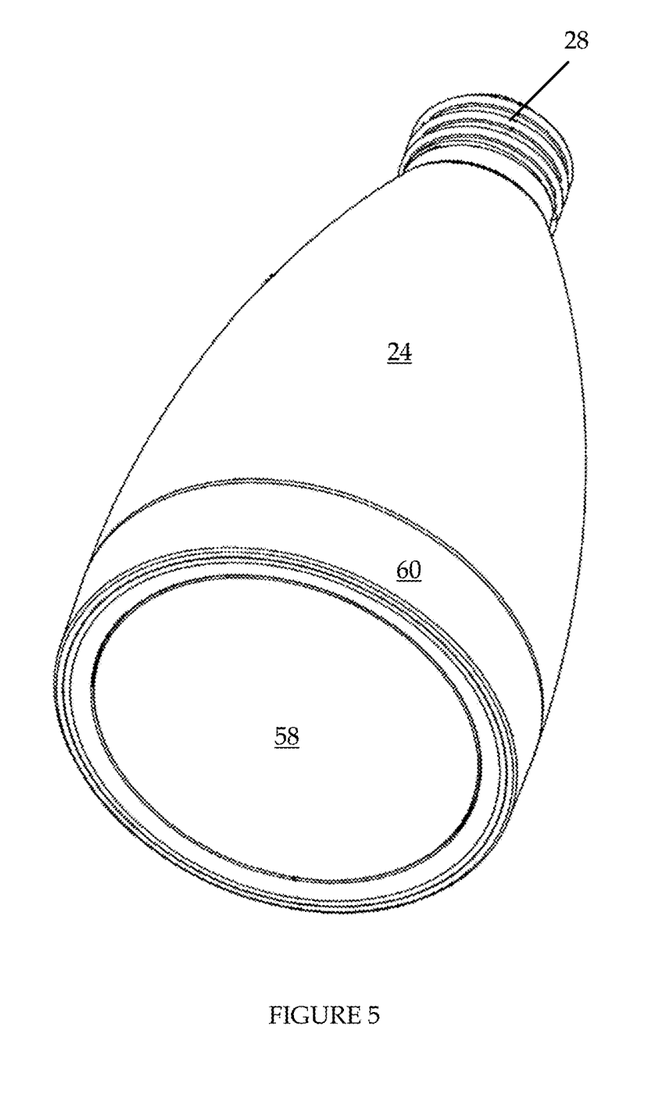
FIG. 5 illustrates a perspective view of the exterior of the lighting device of FIG. 4.

FIG. 5 depicts the bulb exterior housing 24 according to an embodiment of the apparatus. The particular bulb shown is a PAR 30 housing. Other bulb sizes and shapes are also possible, depending on the particular characteristics desired by the designer or consumer for a particular lighting fixture. The lighting device may be adapted to fit virtually any commercially available light fixture including, but not limited to, track lights, incandescent lighting fixtures, recessed can lighting, uplights or spot lights.

FIG. 6 depicts a possible electrical wiring configuration for the lighting device of FIGS. 4 and 5. AC power is provided to a switched-mode power supply (SMPS) 62. The SMPS in turn supplies power to the LED driver 64, the laser driver 66, the motor control 68, and the control board electronics 70. The control board 70 is also wired to each of the LED driver 64, the laser driver 66, and the motor control 68 to communicate control instructions. The LED driver 64 provides power to the LEDs 48. The laser driver 66 provides power to the laser 4. The motor control provides power to the motor 42. This is one possible electrical configuration, and other configurations are also possible depending on the specific effects desired or powered elements located within the device.

The components as previously described may comprise a lighting device adapted to retrofit into a pre-existing light fixture. The lighting device may be adapted to fit virtually any commercially available light fixture including, but not limited to, track lights, incandescent lighting fixtures, recessed can lighting, uplights or spot lights. The lighting devices according to embodiments of the invention provide a pleasing, versatile and unique lighting experience. Additionally, such lighting devices provide an energy efficient way to provide accent lighting to a particular venue, such as a home or party venue. Moreover, the lighting device according to embodiments of the invention may be retrofitted to available light fixtures such as those described previously.

While certain exemplary embodiments have been described and shown in the accompanying drawings, it is to be understood that such embodiments are merely illustrative of and not restrictive on the broad invention, and that this invention is not to be limited to the specific constructions and arrangements shown and described, since various other modifications may occur to those ordinarily skilled in the art.

I claim:

1. A lighting device comprising:
   a direct diode laser not surrounded by a heatsink, the direct diode laser capable of producing a laser light when powered;
   a lens collimating the laser light produced by the direct diode laser;
   a stationary diffraction grating;
   a holographic optical element;
   a spacer having a first end and a second end between the direct diode laser and the lens and having a distance defined as a focal length, wherein the spacer contacts the direct diode laser on the first end and the lens on the second end; and
   a switched mode power supply for providing power to the direct diode laser.

2. The lighting device of claim 1, wherein the direct diode laser is situated within a first end of a housing.

3. The lighting device of claim 2, wherein electrical leads connect the direct diode laser to an electrical power source outside of the housing.

4. The lighting device of claim 2 further comprising an insert securing the lens within the housing.

5. The lighting device of claim 2 wherein the holographic optical element is a diffractive grating.

6. The lighting device of claim 2, wherein the stationary diffraction grating is secured within a second end of the housing by one or more rings.

7. A lighting device comprising:
   a direct diode laser not surrounded by a heatsink, the direct diode laser capable of producing a laser light when powered;
   a lens collimating the laser light produced by the direct diode laser;
   a spacer having a first end and a second end between the direct diode laser and the lens and having a distance defined as a focal length, wherein the spacer contacts the direct diode laser on the first end and the lens on the second end;
   a stationary diffraction grating;
   one or more light-emitting diodes (LEDs); and
   a switched mode power supply for providing power to the direct diode laser and the one or more LEDs.

8. The lighting device of claim 7, further comprising a housing containing the direct diode laser, the lens, the spacer, the stationary diffraction grating, the one or more LEDs, and the switched mode power supply.

9. The lighting device of claim 8, further comprising a motherboard programmed to control the direct diode laser and the one or more LEDs.

10. The lighting device of claim 8, further comprising a holographic optical element situated within the housing and in a light path of the direct diode laser.

11. The lighting device of claim 10, wherein the one or more LEDs are arranged around the holographic optical element.

12. The lighting device of claim 11, further comprising a motor powered by the switched mode power supply and configured to rotate the holographic optical element about an axis coincident with the light path of the direct diode laser.

13. The lighting device of claim 12, further comprising a cover having lumens for permitting light from the direct diode laser and the one or more LEDs to pass through.

* * * * *